United States Patent
Yu et al.

(10) Patent No.: US 7,604,041 B2
(45) Date of Patent: Oct. 20, 2009

(54) HEAT SINK CLIP

(75) Inventors: Fang-Xiang Yu, Shenzhen (CN); Chin-Lung Chen, Tu-Cheng (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 532 days.

(21) Appl. No.: 11/309,378

(22) Filed: Aug. 2, 2006

(65) Prior Publication Data

US 2007/0139891 A1 Jun. 21, 2007

(30) Foreign Application Priority Data

Dec. 15, 2005 (CN) .................... 2005 1 0120710

(51) Int. Cl.
*H05K 7/20* (2006.01)
(52) U.S. Cl. .................. 165/80.3; 165/80.2; 361/704; 24/455; 24/458
(58) Field of Classification Search ............... 165/80.3, 165/185; 361/704, 710
See application file for complete search history.

(56) References Cited

U.S. PATENT DOCUMENTS

| 2,347,136 | A | * | 4/1944 | Speckert | 407/94 |
| 2,575,301 | A | * | 11/1951 | Shafter | 241/32 |
| 2,862,435 | A | * | 12/1958 | Buchenberger et al. | 454/204 |
| 5,870,287 | A | * | 2/1999 | Rodriguez et al. | 361/704 |
| 6,318,452 | B1 | | 11/2001 | Lee | |
| 6,480,386 | B1 | * | 11/2002 | Yu | 361/704 |
| 6,519,155 | B1 | * | 2/2003 | Walkup | 361/704 |
| 6,722,222 | B1 | * | 4/2004 | Dolan et al. | 74/422 |
| 6,778,395 | B1 | * | 8/2004 | Dong et al. | 361/704 |
| 2002/0036891 | A1 | * | 3/2002 | Lo | 361/704 |
| 2003/0218866 | A1 | * | 11/2003 | Chen et al. | 361/704 |
| 2004/0190262 | A1 | * | 9/2004 | Lai et al. | 361/704 |

FOREIGN PATENT DOCUMENTS

| CN | 02225926.0 | | 2/2002 |
| CN | 02270874.X | | 6/2002 |
| SU | 859712 B | * | 9/1981 |

\* cited by examiner

*Primary Examiner*—Allen J Flanigan
(74) *Attorney, Agent, or Firm*—Frank R. Niranjan

(57) ABSTRACT

A heat sink clip for securing a heat sink to a heat generating electronic component includes a spring member including an elongated main body. A connecting portion is formed at one end of the main body and a first locking leg extends from the other end thereof. A second locking leg is coupled to the connecting portion of the spring member. An actuating member connects pivotally with the second locking leg. An assisting member, which is located between the actuating member and the connecting portion, includes a wedged main body. When the actuating member is rotated from a first orientation to a second orientation, the assisting member horizontally moves a distance thereby moving the actuating member to a raised level. The actuating member has teeth engaging with teeth formed on an inclined face of the wedged main body.

19 Claims, 6 Drawing Sheets

HEAT SINK CLIP

FIELD OF THE INVENTION

The present invention relates generally to clips, and more particularly to a clip which secures a heat sink to a heat generating electronic component easily and conveniently.

DESCRIPTION OF RELATED ART

CPU (central processing unit) is the computing and control unit of a computer for interpreting and executing all kinds of instructions. By means of the definition, the CPU functions as the "brain" of the computer. With fast development in computer technology, advanced CPUs are made to have relatively smaller size but relatively faster operational speed. During operation of such an advanced CPU, a large amount of heat is generated. In order to dissipate the heat from the CPU, a heat sink or other cooling device is used. Oftentimes, the heat sink is secured to the CPU by a clip.

Referring to FIG. 6, a heat sink clip in accordance with related art includes a first member 81 and a second member 82 coupled to the first member 81. The clip secures a heat sink 84 to a retention frame 83 which surrounds a CPU 85 supported on a circuit board (not labeled). The retention frame 83 has first and second catches 831, 832 at opposite sides thereof. The first member 81 of the clip includes a spring portion 811 and a first leg 812 extending downwardly from an end of the spring portion 811. The leg 812 defines a first hole 813 for engaging with the first catch 831 of the retention frame 83. A pair of fingers 814 extends from the other end of the spring portion 811 to define a receiving slot 815 for receiving and holding the second member 82 therein. The second member 82, which is L-shaped, includes a pressing portion 821 located above the spring portion 811 of the first member 81 for manual operations, and a second leg 822 defining a second hole 823 for engaging with the second catch 832 of the retention frame 83. The spring portion 811 deforms to generate a spring force against the heat sink 84 for securing the heat sink 84 to the CPU 85 when the clip is mounted to the retention frame 83.

In order to fix the heat sink 84 to the CPU 85, a large force is required to operate the pressing portion 821. Furthermore, it is difficult to manipulate the pressing portion 821 to engage the second hole 823 with the second catch 832.

Therefore, it is desirable to provide a heat sink clip which can overcome the above-mentioned disadvantages.

SUMMARY OF THE INVENTION

The present invention relates to a heat sink clip for attaching a heat sink to a heat generating electronic component. The heat sink clip includes a spring member including an elongated main body. A connecting portion connects at one end of the main body and a first locking leg extends from the other end thereof. A second locking leg is coupled to the connecting portion of the spring member. An actuating member connects pivotally with the second locking leg. An assisting member, which is located between the actuating member and the connecting portion, includes a wedged main body operatively engaged with the actuating member. When the actuating member is rotated from a first orientation to a second orientation, the actuating member is raised by the assisting member, whereby the second locking log is lifted to have a tight engagement with retention member.

Other advantages and novel features of the present invention will become more apparent from the following detailed description of preferred embodiment when taken in conjunction with the accompanying drawings, in which:

BRIEF DESCRIPTION OF THE DRAWINGS

Many aspects of the present heat sink clip can be better understood with reference to the following drawings. The components in the drawings are not necessarily drawn to scale, the emphasis instead being placed upon clearly illustrating the principles of the present heat sink clip. Moreover, in the drawings, like reference numerals designate corresponding parts throughout the several views.

DETAILED DESCRIPTION OF THE INVENTION

Figure 1:
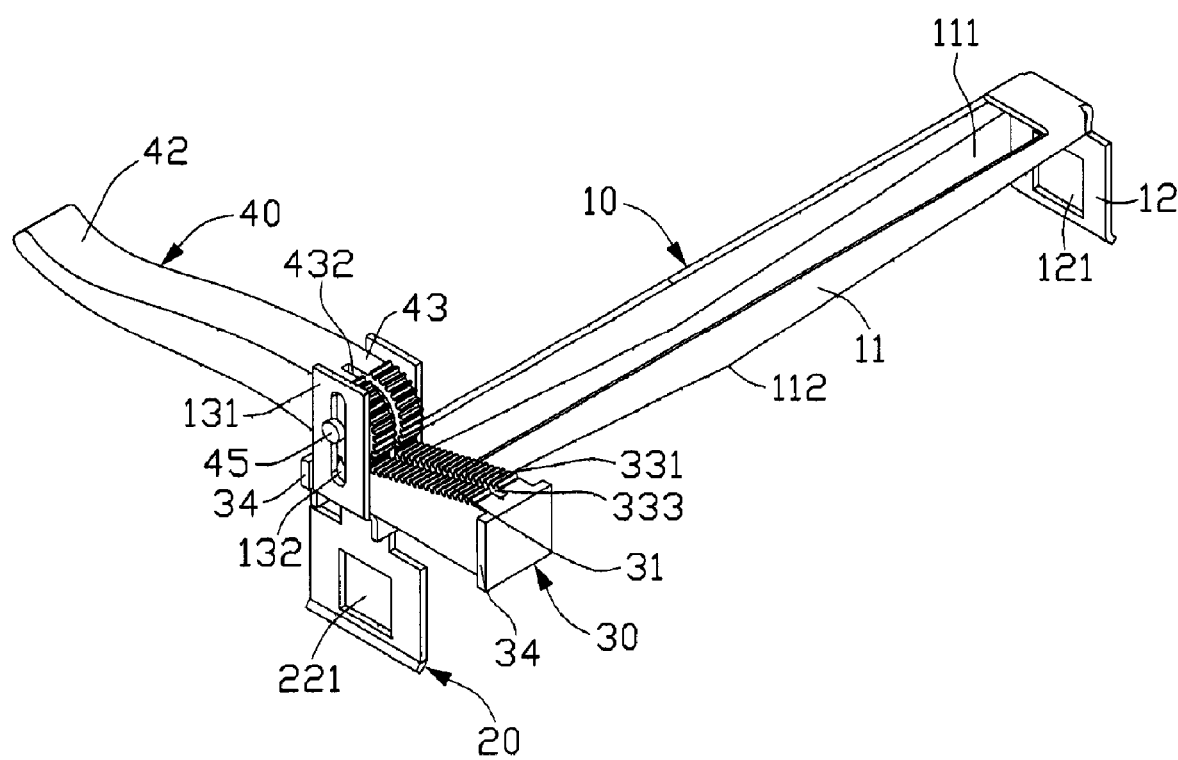
FIG. 1 is an assembled, isometric view of a heat sink clip in accordance with a preferred embodiment of the present invention.
Figure 2:
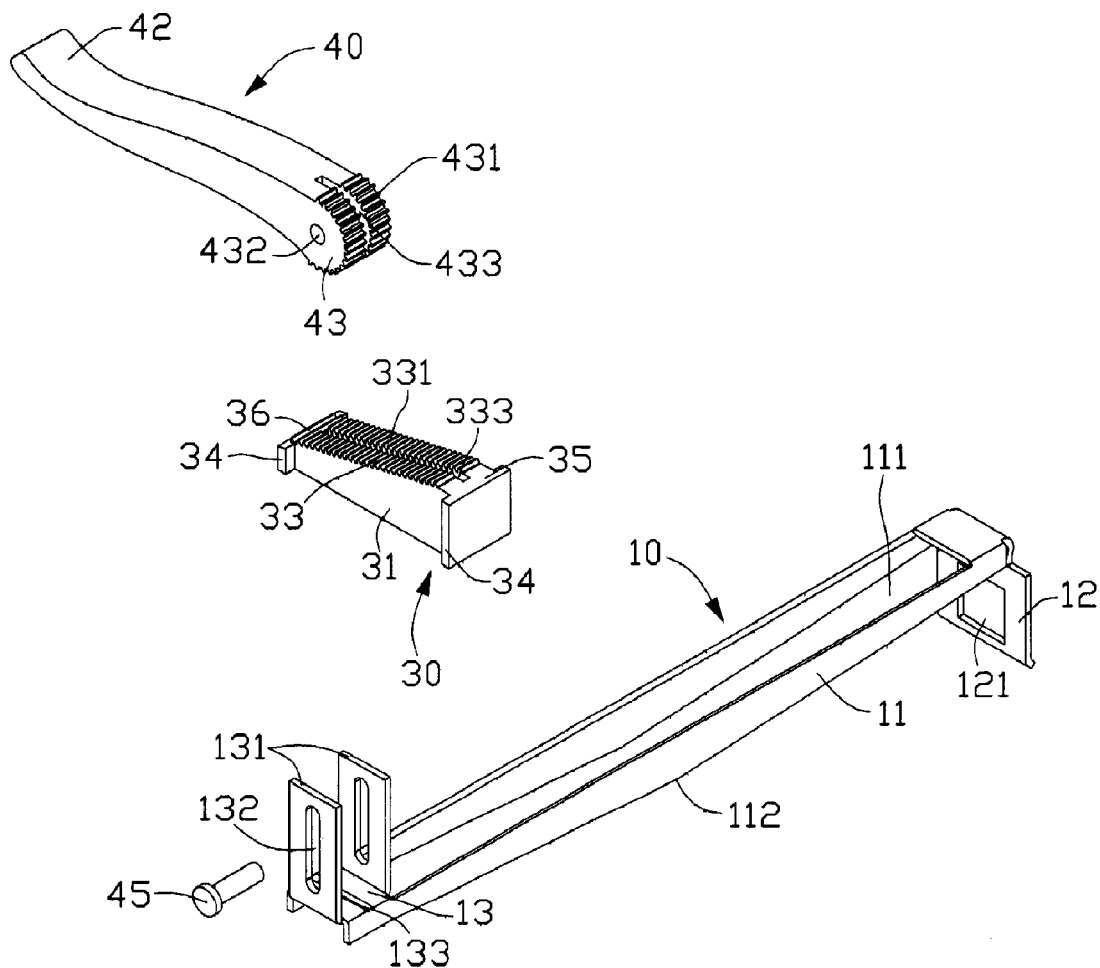
FIG. 2 is an exploded, isometric view of the heat sink clip of FIG. 1.
Figure 2:
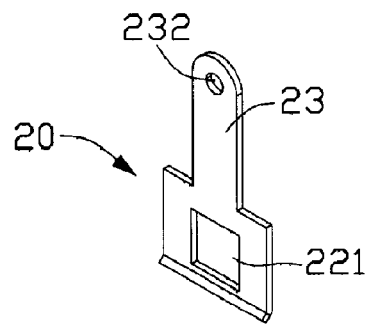

Referring to FIGS. 1-2, a heat sink clip 1 in accordance with a preferred embodiment of the present invention is shown. The heat sink clip 1 includes a spring member 10 having a first locking leg 12 thereon, a second locking leg 20, an assisting member 30 and an actuating member 40.

The spring member 10 is typically made of resilient metal material such as stainless steel and includes an elongated main body 11 defining an elongated cutout 111 therein for saving the material. The main body 11 has a V-shaped pressing portion 112 at a middle thereof. The first locking leg 12 extends downwardly from a first end of the pressing portion 112 in a direction perpendicular to the main body 11 and defines a first mounting hole 121 near a bottom thereof. A connecting portion 13, through which a first slot 133 is defined therethrough, is formed at the other end of the main body 11. A pair of connecting plates 131 extend upwardly from the connecting portion 13 and are located at opposite sides of the first slot 133. Each of the connecting plates 131 has a vertical, elongated slot 132 therein.

The second locking leg 20 is coupled to the connecting portion 13 of the spring member 10 and includes an inverted T-shaped plate 23. A second mounting hole 221 is defined in a bottom end of the plate 23. A first through hole 232 is defined in a top end of the plate 23. The top end of the plate 23 is inserted through the first slot 133 of the connecting portion 13 of the spring member 10 and projects above the connecting portion 13.

The assisting member 30, which is typically made of plastic material, has a wedged main body 31 which has a width slightly smaller than the spacing between the connecting plates 131 of the connecting portion 13 for disposing of the main body 31 between the connecting plates 131. The main body 31 includes a first end portion 35 and a second end portion 36 having a size smaller than that of the first end portion 35. Thus, an inclined top surface 33 is formed between the first end portion 35 and the second end portion 36. The inclined top surface 33 is inclined from the second end portion 36 towards the first end portion 35. A pair of protrusions 34 extend laterally outwardly from opposite sides of each of the first and second end portions 35, 36, so as to prevent the main body 31 from slipping off from the connecting portion 13 of the spring member 10. A plurality of teeth 331 is formed over the inclined top surface 33. A second slot 333 is vertically defined through the main body 31 from the first end portion 35 to the second end portion 36 of the main body 31. The second slot 333 extends through a middle of the teeth 333.

The actuating member 40 is also made of plastic material, having a handle portion 42 at one end thereof and a round rotating portion 43 at the other end thereof. The rotating portion 43 has a rounded shape and comprises a plurality of teeth 431 arranged on a circumferential surface thereof. The teeth 431 correspond to the teeth 331 of the assisting member 30. A second through hole 432 is defined through the rotating portion 43. Also in the rotating portion 43, a third slot 433 is defined across the second through hole 432. A diameter of the second through hole 432 is substantially equal to that of the first through hole 232 of the second locking leg 20. A width of each of the second slot 333 and the third slot 433 is slightly greater than a thickness of the plate 23 of the second locking leg 20. The third slot 433 extends through a middle of the teeth 431.

Referring to FIG. 1, the assisting member 30 is arranged on the connecting portion 13 of the spring member 10, between the connecting plates 131 wherein the second slot 333 of the assisting member 30 corresponds to the first slot 133 of the connecting portion 13. The actuating member 40 is then supported on the inclined top surface 33 of the assisting member 30 to ensure that the teeth 431 engage with the teeth 331. The top end of the plate 23 of the second locking leg 20 passes successively through the first slot 133 of the connecting portion 13 and the second slot 333 of the assisting member 30, and enters into the third slot 433 of the actuating member 40. Thereafter, a pin 45 is inserted through the elongated slots 132 of the connecting plates 131, the second through hole 432 of the actuating member 40 and the first through hole 232 of the second locking leg 20 to thereby pivotally secure the second locking leg 20 and the actuating member 40 to the connecting plates 131 of the spring member 10. The actuating member 40 is located in a direction substantially perpendicular to the spring member 10 and projects laterally outwardly from the main body 11 of the spring member 10.

Figure 3:
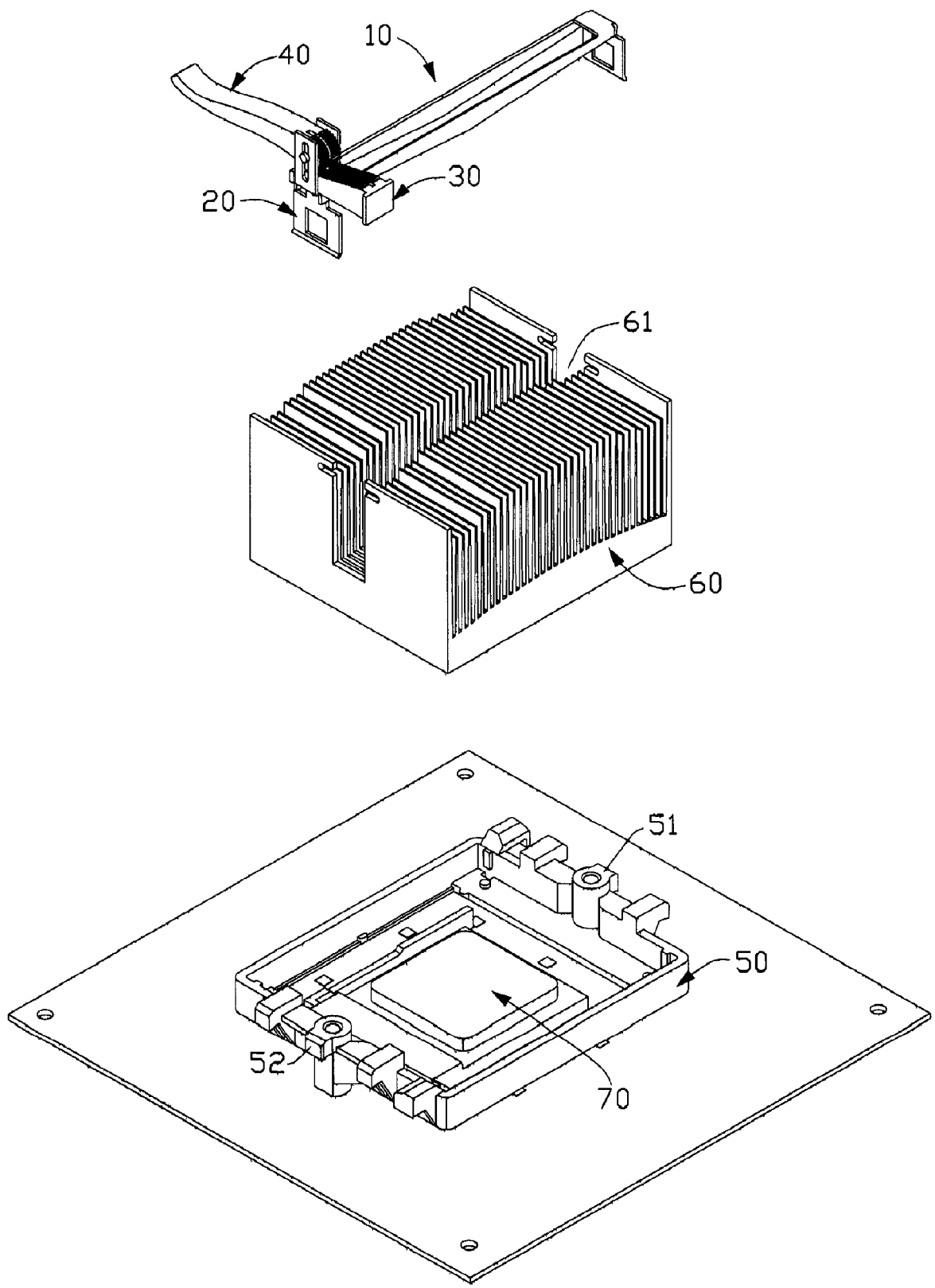
FIG. 3 is an exploded, isometric view of a heat dissipation assembly incorporating the heat sink clip of FIG. 1.
Figure 4:
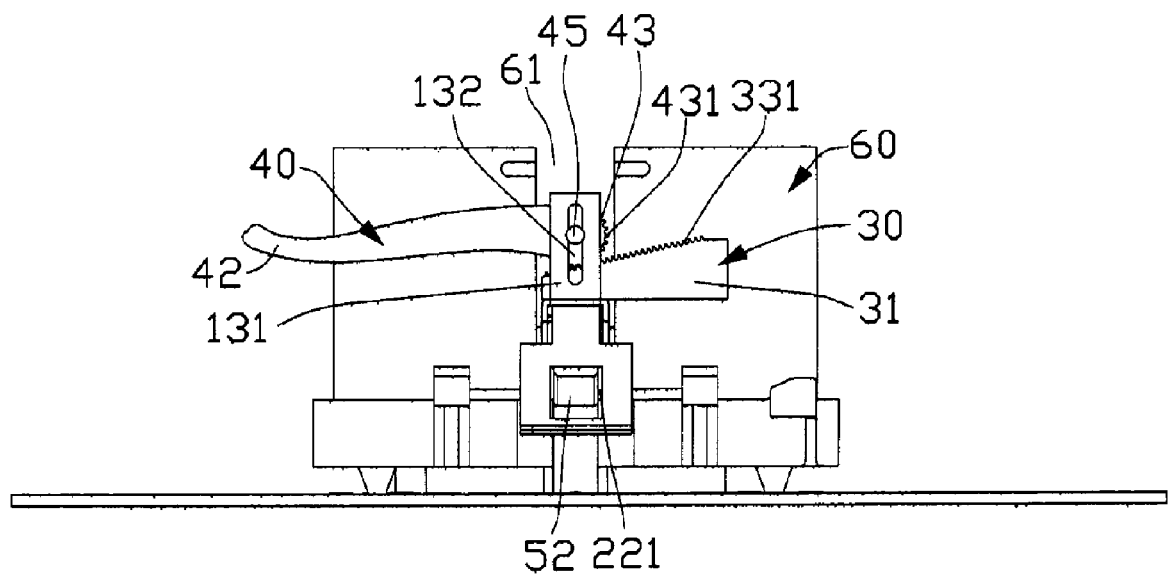
FIG. 4 is an assembled, side view of the heat dissipation assembly of FIG. 3, showing the heat sink clip being in an unlocked position.
Figure 5:
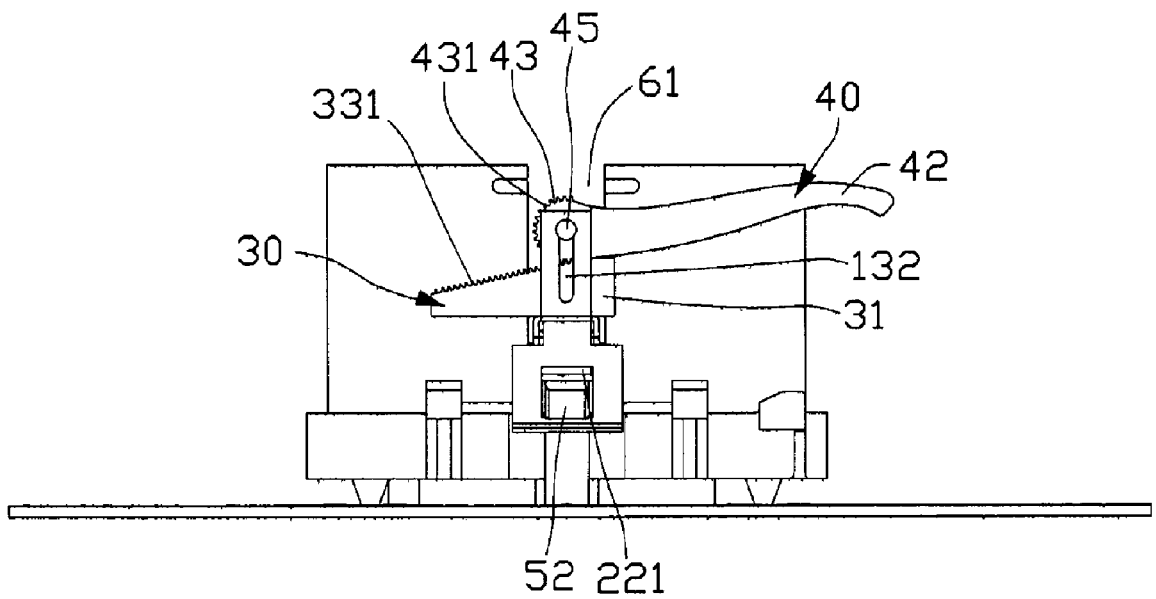
FIG. 5 is similar to FIG. 4, but shows the heat sink clip in a locked position.
Figure 6:
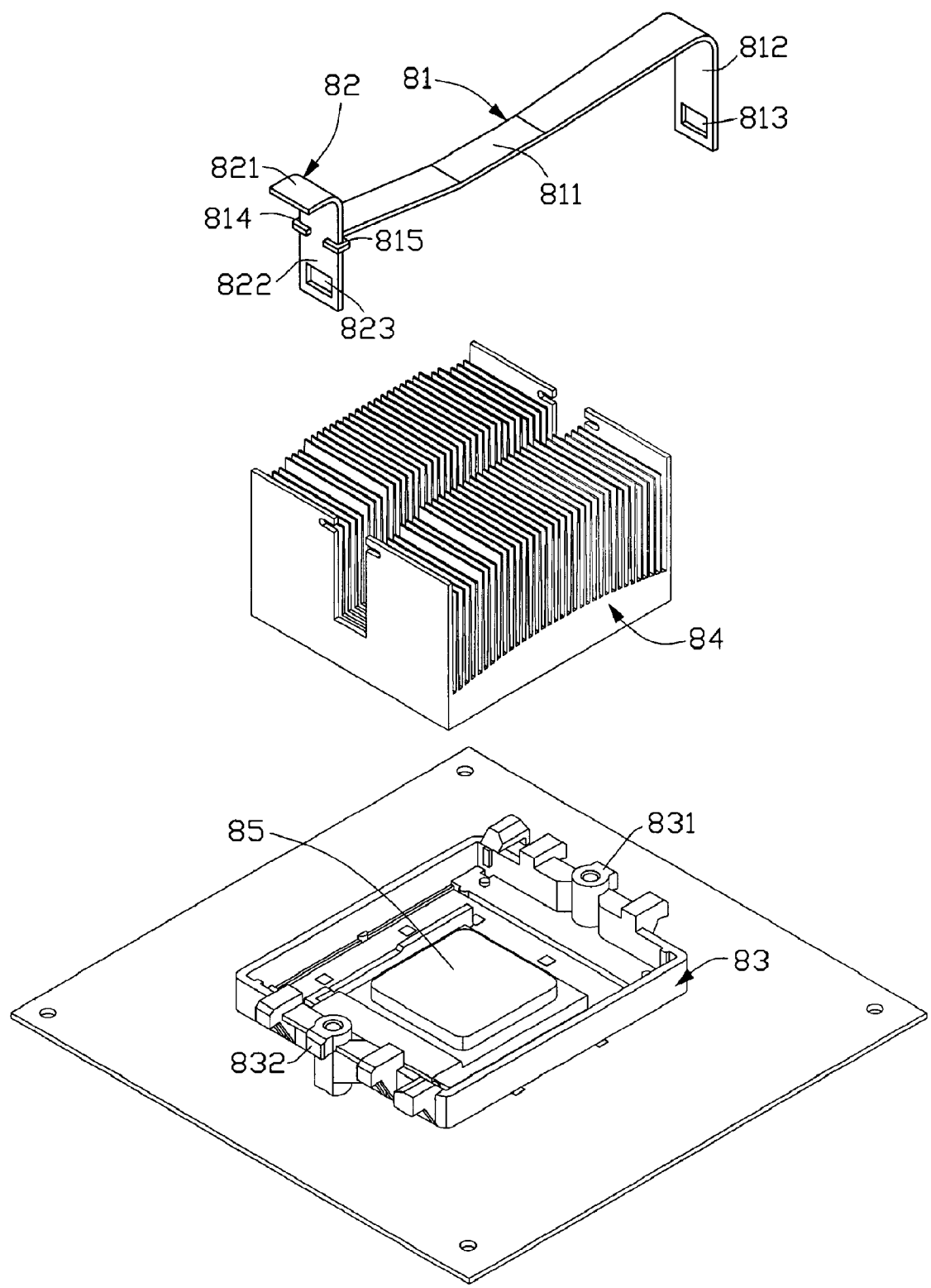
FIG. 6 is an exploded, isometric view of a heat dissipation assembly in accordance with related art.

Referring to FIGS. 3-5, the heat sink clip 1 is illustrated to secure a heat sink 60 to a retention frame 50 surrounding a heat generating electronic component 70 (such as a CPU) supported on a circuit board (not labeled). The heat sink 60 defines a locating groove 61 in a middle portion thereof for accommodating the main body 11 of the spring member 10. The retention frame 50 defines two first and second catches 51, 52 at two opposite sides thereof, corresponding to the first and second mounting holes 121, 221 of the first and second locking legs 12, 20, respectively.

In assembly, the main body 11 of the heat sink clip 1 is placed in the locating groove 61 of the heat sink 60. The first and second mounting holes 121, 221 of the first and second locking legs 12, 20 loosely receive the first and second catches 51, 52 of the retention frame 50, respectively, as shown in FIG. 4. Being in a horizontal position, the handle portion 42 of the actuating member 40 is located at a left side of the spring member 11. As located between the connecting plates 131 of the spring member 10, the rotating portion 43 of the actuating member 40 engages with the main body 31 of the assisting member 30 near the second end portion 36 (shown in FIG. 2) thereof, wherein the second end portion 36 is lower than the first end portion 35. The first end portion 35 (shown in FIG. 2) of the assisting member 30 is located at a right side of the spring member 10. At this moment, the heat sink clip 1 is located at an unlocked position.

Then, the handle portion 42 of the actuating member 40 is rotated in a clockwise direction, and the teeth 431 on the rotating portion 43 enter into engagement with the teeth 331 formed on the inclined top surface 33 of the assisting member 30. As a result, the assisting member 30 moves linearly and horizontally from the right side towards the left side of the spring member 10. Due to the height difference between the first end portion 36 and the second end portion 35 of the assisting member 30, the actuating member 40 is pushed to move upwardly along the elongated slots 132 whereby the second locking leg 20 is driven to move upwardly in a direction perpendicular to the retention frame 50 to motivate the heat sink clip 1 to firmly engage with the retention frame 50. At this stage, the heat sink clip is located at a locked position, as shown in FIG. 5. The handle portion 42 of the actuating member 40 is located horizontally at the right side of the spring member 11. The rotating portion 43 of the actuating member 40 engages with the main body 31 of the assisting member 30 near the first end portion 35 thereof. The second end portion 36 of the assisting member 30 is located at the left side of the spring member 10. The first and second mounting holes 121, 221 of the first and second locking legs 12, 20 firmly receive the first and second catches 51, 52 of the retention frame 50 therein, whereby the heat sink 60 is maintained in intimate thermal contact with the CPU 70 for dissipating heat generated by the CPU 70.

When the heat sink clip 1 is disassembled, the handle portion 42 of the actuating member 40 is operated in a counterclockwise direction whereby the heat sink clip is released.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink clip comprising:
a spring member including an elongated main body, a connecting portion formed at one end of the main body and a first locking leg extending from another end thereof;
a second locking leg coupled to the connecting portion of the spring member;
an actuating member connecting pivotally with the second locking leg; and
an assisting member located between the actuating member and the connecting portion, including a wedged main body operatively engaged with the actuating member, the wedged main body having a lower end and a higher end, wherein when the actuating member is rotated from a first orientation to a second orientation, the actuating member is motivated by the wedged main body to move from the lower end thereof to the higher end thereof.

2. The heat sink clip of claim 1, wherein the main body of the spring member includes a V-shaped pressing portion at a middle portion thereof.

3. The heat sink clip of claim 1, wherein the actuating member has one end thereof terminating in a rotating portion defining a plurality of first teeth thereon, and a plurality of second teeth are formed on an inclined top surface of the wedged main body of the assisting member, corresponding to and engaging with said first teeth.

4. The heat sink clip of claim 3, wherein the spring member has a pair of connecting plates extending from the connecting portion, at least one of the connecting plates defines an elongated slot therein, and the connecting portion defines a first slot therethrough, the first slot of the connecting portion being located between the connecting plates, the wedged main body of the assisting member and the rotating portion of the actuating member being received between the connecting plates.

5. The heat sink clip of claim 4, wherein the first locking leg is monolithic with the main body of the spring member, the second locking leg has a top end extending through the first slot of the connecting portion and projects above the connecting portion.

6. The heat sink clip of claim 5, wherein the wedged main body of the assisting member defines a second slot therethrough, and the rotating portion defines a third slot therein, wherein the top end of the second locking leg which projects above the connecting portion passes through the second slot of the assisting member and enters into the third slot of the actuating member.

7. The heat sink clip of claim 5, wherein the top end of second locking leg defines a first though hole therein, the rotating portion of the actuating member defines a second through hole therein, and a pin extends successively through the elongated slot of the at least one connecting plate, said second through hole and said first through hole to pivotally secure the second locking leg to the rotating portion of the actuating member.

8. The heat sink clip of claim 4, wherein at least a protrusion extends from each of two ends of the wedged main body of the assisting member, the protrusion being engageable with the connecting plates to prevent the assisting member from separating from the connecting portion of the spring member.

9. The heat sink clip of claim 1, wherein the assisting member and the actuating member are made of plastic material.

10. A heat dissipation assembly comprising:
a retention frame having a first engaging unit at each of a pair of opposite sides thereof;
a heat sink seated adjacent to the retention frame; and
a clip for securing the heat sink to the retention frame, comprising:
a spring member including a main body, a first locking leg extending downwardly from one end of main body;
a second locking leg connected to another end of the main body, the first and second locking legs each having a second engaging unit thereon;
an actuating member connecting pivotally with the second locking leg; and
an assisting member having a main body engaged with the actuating member, the main body of the assisting member including a lower section and a higher section, the assisting member being moveable between a first position at which said actuating member engages with said lower section and a second position at which said actuating member engages with said higher section, wherein when the assisting member moves from said first position to said second position, said second engaging units of the first and second locking legs are brought into engagement with the first engaging units of the retention frame.

11. The heat dissipation assembly of claim 10, wherein the first engaging unit is a catch while the second engaging unit is a mounting hole.

12. The heat dissipation assembly of claim 10, wherein the actuating member has one end thereof terminating in a rotating portion defining a plurality of first teeth thereon, and a plurality of second teeth corresponding to and engaging with the first teeth are formed on the main body of the assisting member from said lower to said higher section of the main body of the assisting member.

13. The heat dissipation assembly of claim 12, wherein a connecting portion is formed at the another end of the main body of the spring member, and a pair of spaced connecting plates extend upwardly from the connecting portion and at least one of the connecting plates defines an elongated slot therein, and the connecting portion defines a first slot therethrough between the connecting plates.

14. The heat dissipation assembly of claim 13, wherein a top end of the second locking leg passes through the first slot and projects above the connecting portion.

15. The heat dissipation assembly of claim 14, wherein the main body of the assisting member is wedge-shaped and defines a second slot therethrough, and the rotating portion defines a third slot therein, wherein the top end of the second locking leg which projects above the connecting portion passes through the second slot of the assisting member and enters into the third slot of the actuating member.

16. The heat dissipation assembly of claim 10, wherein the assisting member has a linear, horizontal movement when the assisting member moves from said first position to said second position.

17. A heat sink assembly comprising:
a heat sink defining a groove therein; and
a heat sink clip received in the groove and comprising:
an elongated body having an end;
an assisting member positioned on the end of the elongated body, defining a plurality of first teeth thereon extending from a first end portion to a second end portion of the assisting member, wherein the first end portion is lower than the second end portion;
an actuating member having a round end with a plurality of second teeth formed thereon, the second teeth engaging with the first teeth; and
a locking leg having an upper end extending upwardly through the end of the elongated body and the assisting member to pivotably connect with the actuating member;
wherein when the actuating member is rotated from a first orientation to a second orientation, the actuating member is motivated to move from the first end portion to the second end portion of the assisting member.

18. The heat sink assembly of claim 17, wherein the assisting member is horizontally movably positioned on the end of the elongated body of the clip.

19. The heat sink assembly of claim 18, wherein the end of the elongated body forms two connecting plates, the actuating member and the locating member being received between the two connecting plates, each of the connecting plates having a vertically elongated slot therein, a pin extending through the elongated slots, the upper end of the locking leg and the round end of the actuating member to thereby pivotally secure the locking leg and the actuating member to the connecting plates.

* * * * *

UNITED STATES PATENT AND TRADEMARK OFFICE
CERTIFICATE OF CORRECTION

PATENT NO. : 7,604,041 B2  Page 1 of 1
APPLICATION NO. : 11/309378
DATED : October 20, 2009
INVENTOR(S) : Yu et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 611 days.

Signed and Sealed this

Fifth Day of October, 2010

David J. Kappos
*Director of the United States Patent and Trademark Office*